US005747995A

United States Patent [19]

Spies

[11] Patent Number: 5,747,995

[45] Date of Patent: May 5, 1998

[54] MAGNETIC POSITION MEASURING DEVICE USING HALL ELEMENTS AS SENSORS AND METHOD FOR ITS OPERATION

[75] Inventor: Alfons Spies, Seebruck, Germany

[73] Assignee: Dr. Johannes Heidenhain GmbH, Traunreut, Germany

[21] Appl. No.: 715,648

[22] Filed: Sep. 18, 1996

[30] Foreign Application Priority Data

Sep. 30, 1995 [DE] Germany ........................ 195 36 661.1

[51] Int. Cl.[6] ............................... G01B 7/14; G01D 5/14; G01D 3/28; G01R 33/07

[52] U.S. Cl. ................................. 324/207.2; 324/207.12; 324/207.24; 324/251

[58] Field of Search .................................... 324/173, 174, 324/207.12, 207.2, 207.21, 207.22, 207.24, 251; 310/12; 318/135

[56] References Cited

U.S. PATENT DOCUMENTS

| | | | |
|---|---|---|---|
| 3,243,692 | 3/1966 | Heissmeier et al. | 324/207.2 X |
| 4,612,502 | 9/1986 | Spies | 324/207.22 |
| 4,668,914 | 5/1987 | Kersten et al. | 324/251 |
| 5,406,202 | 4/1995 | Mehrgardt et al. | 324/251 |
| 5,621,319 | 4/1997 | Bilotti et al. | 324/251 |

FOREIGN PATENT DOCUMENTS

| | | |
|---|---|---|
| 43 02 342 A1 | 7/1993 | Germany. |
| 2056692 | 3/1981 | United Kingdom. |
| WO94/05975 | 3/1994 | WIPO. |

OTHER PUBLICATIONS

Munter, P., "A Low-Offset Spinning-Current Hall Plate," *Sensors and Actuators*, A21-A23, pp. 743-746 (1990).

*Primary Examiner*—Gerard R. Strecker
*Attorney, Agent, or Firm*—Brinks, Hofer, Gilson & Lione

[57] ABSTRACT

In a magnetic position measuring device for determining the relative position of two objects which can be moved with respect to each other, a magnetic graduation is scanned by at least two Hall elements for the generation of position-dependent output signals. The Hall elements respectively have at least one supply voltage and one measuring voltage connector. Furthermore, at least one switching unit is provided, which periodically interchanges the supply voltage and the measuring voltage connectors of each Hall element with each other. The periodic interchange of the supply voltage and measuring voltage connectors of the various Hall elements with each other is furthermore synchronized by means of at least one synchronization unit.

12 Claims, 4 Drawing Sheets

MAGNETIC POSITION MEASURING DEVICE USING HALL ELEMENTS AS SENSORS AND METHOD FOR ITS OPERATION

FIELD OF THE INVENTION

The present invention relates to a magnetic position measuring device for determining the relative position of two objects which are movable with respect to each other, wherein a magnetic graduation is scanned by means of at least two Hall elements for generating position-dependent output signals, wherein the Hall elements each have at least one supply voltage and one measuring voltage connector. The present invention further relates to a method for operating the above mentioned magnetic position measuring device.

BACKGROUND OF THE INVENTION

Position measuring devices based on magnetic measuring principles are gaining increased importance next to the known position measuring devices operating in accordance with optical principles. The reduced susceptibility of such position measuring devices to dirt makes their use attractive, for example, in the field of machine tools. The known magnetic position measuring devices have a magnetic graduation that is scanned by a scanning unit containing suitable magnetic sensors. Output signals of the magnetic sensors are generated which, in turn, are supplied to known evaluation and interpolation devices. The magnetic graduations employed can be embodied, analogously with optical measuring systems, as graduations with fixed graduation periods, or they may have a defined code pattern.

U.S. Pat. No. 4,612,502 discloses a position measuring device wherein Hall elements are employed as magnetically sensitive sensor elements in the scanning unit. An existing problem when using Hall elements as sensors is the zero voltage drift or offset fluctuations of the Hall elements. Such offset fluctuations of Hall elements are the result of inhomogeneities in the material, mechanical stresses of the Hall elements as well as manufacturing tolerances which were not exactly maintained. Thus the occurring offset fluctuations cause undesirable errors when using Hall elements as sensors sensitive to magnetic fields in magnetic position measuring devices.

SUMMARY OF THE PRESENT INVENTION

It is an object of the present invention to provide a magnetic position measuring device with Hall elements as sensors sensitive to magnetic fields, in which offset fluctuations are eliminated.

In addition, it is an object of the present invention to provide a method for operating a magnetic position measuring device, wherein the above mentioned problems are minimized.

The method and device in accordance with the present invention assures the desired elimination of the interfering and signal- distorting offset fluctuations. This is achieved by the employment of Hall elements which are operated in accordance with the so-called "spinning current principle", such as has been proposed, for example, in German Patent Publication No. DE 43 02 342 or as described in "A Low-Offset Spinning-Current Hall Plate," by P. J. A. Munter in *Sensors and Actuators, Vol.* A22, No. 1-3, pp. 743–746 (March 1990).

Depending on the desired measurement accuracy, it is possible at any time to employ even more than the minimum required two Hall elements in a magnetic position measuring device in defined relative arrangements.

Furthermore, in connection with the Hall elements operated in accordance with the present invention, known evaluation and interpolating units can be used for the actual position determination, such as are known in connection with conventional synchro resolvers.

There are also a number of possibilities for combining the Hall elements with the required switching and synchronization units. In this way a flexible adaptation of the device in accordance with the present invention to the measurement requirements as a function of the desired circuitry outlay or the desired measurement accuracy is possible.

The integration of all sensor components on a single sensor chip has furthermore proven to be advantageous, wherein a compact sensor for a magnetic position measuring device is made available.

Further advantages as well as details of the device in accordance with the present invention or of the method in accordance with the present invention ensue from the following description of exemplary embodiments by means of the attached drawings.

DETAILED DESCRIPTION OF THE PRESENTLY PREFERRED EMBODIMENTS

Figure 1:
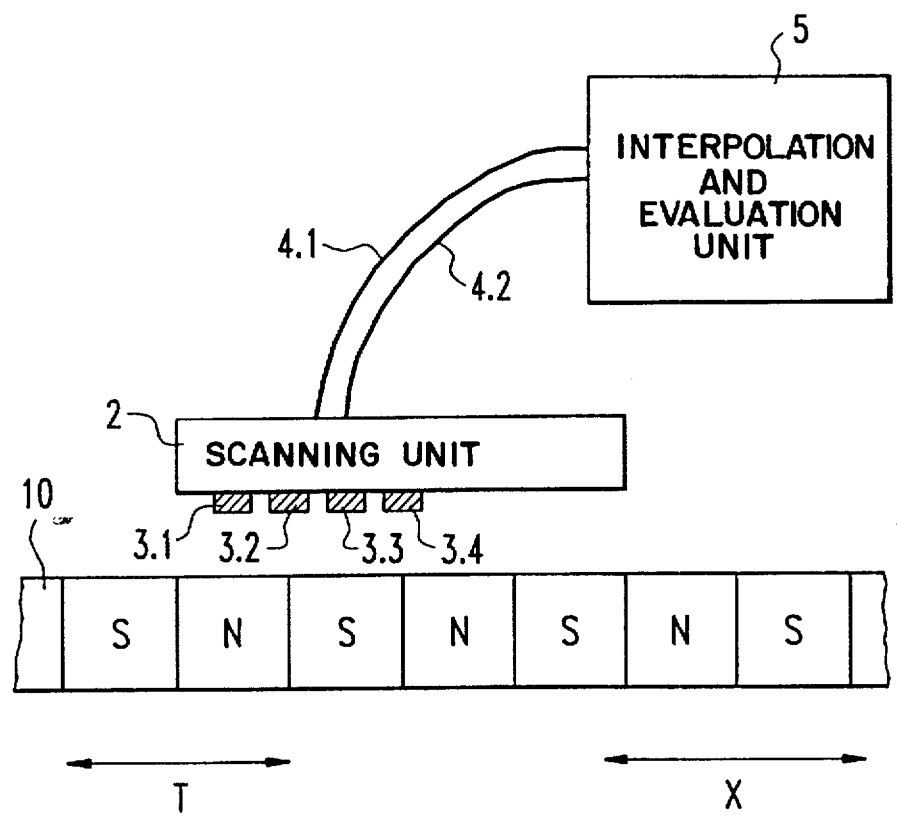
FIG. 1 illustrates a schematic representation of a magnetic position measuring device in accordance with a preferred embodiment of the present invention.

FIG. 1 illustrates a schematic representation of a magnetic position measuring device in accordance with a preferred embodiment of the present invention. The magnetic position measuring device includes a magnetic graduation 10, a scanning unit 2, in a preferred embodiment, four Hall elements 3.1, 3.2, 3.3 and 3.4, an evaluation and interpolation unit 5 and electrical connection lines 4.1 and 4.2. The magnetic graduation has a defined magnetic pattern applied thereto. The Hall elements 3.1, 3.2, 3.3 and 3.4 are employed as sensors that are sensitive to a magnetic field and their mode of operation will be described in greater detail hereinafter. The evaluation and interpolation unit 5 converts the output of the scanning unit 2 into counting pulses.

In the preferred embodiment shown in FIG. 1, the magnetic graduation 1 is magnetized in a one-sided, multipolar form, wherein north and south poles (N and S respectively) alternatingly abut against each other. The length resulting from the distance between two north or south poles in the measuring direction X is the magnetic graduation period T. Alternately it is also possible to provide other magnetizing patterns, such as a so-called axially one-sided magnetization or an irregular magnetization pattern. Furthermore, the respectively scanned magnetic graduation can also be realized by an arrangement of electromagnets. In addition, the measuring device can be realized in accordance with the present invention, but with a radial embodiment of the magnetic graduation to be used in an angular-position measuring device.

In a possible application the magnetic graduation 1 is coupled to the bed of a machine tool (not shown) while the scanning unit 2 with the Hall elements 3.1, 3.2, 3.3, 3.4 is coupled to a linearly movable carriage element (not shown) of the machine.

Figure 2:
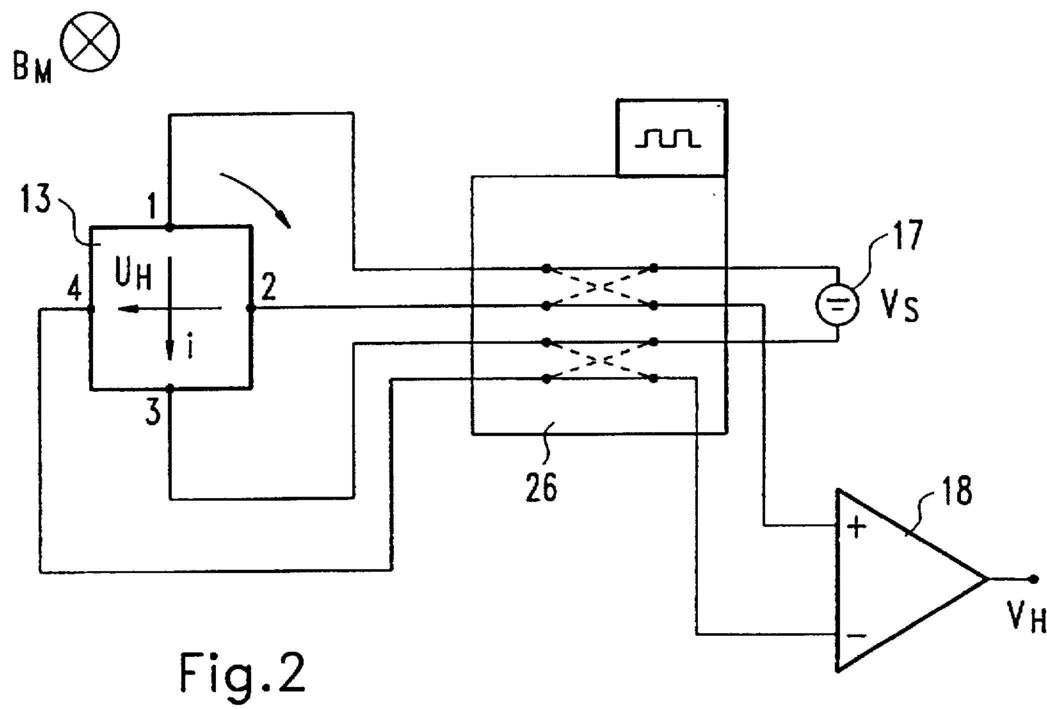
FIG. 2 illustrates the principle mode of operation of the Hall elements employed.
Figure 3A:
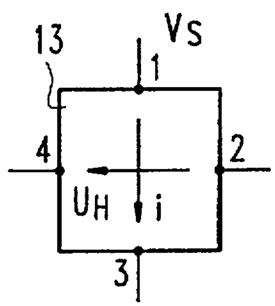
FIGS. 3A to 3D respectively show a different switching phase of the employed Hall elements shown in FIG. 2.
Figure 3B:
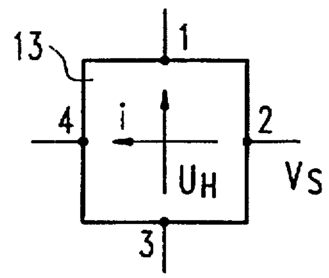
Figure 3C:
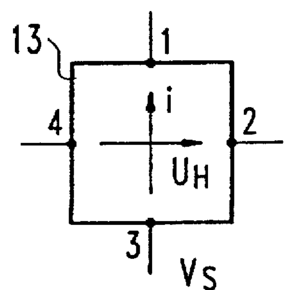
Figure 3D:
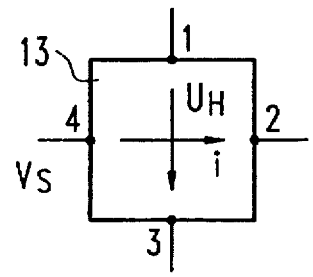

FIG. 2 illustrates the principle mode of operation of the Hall elements employed. The represented Hall element 13 is of square shape and has two supply voltage connectors 1, 3 and two measuring voltage connectors 2, 4 offset by 90° with respect to the supply voltage connectors 1, 3. The magnetic field $B_M$ generated by the magnetic graduation 10 to be detected or the corresponding magnetic field components are perpendicularly oriented with respect to the Hall element 13. When applying a supply voltage $V_S$ to the two connectors 1 and 3, if there is a magnetic field $B_M$ present, a Hall voltage $U_H$ can be picked up in a known manner from the two measuring voltage connectors 2 and 4, which represents a measure of the external magnetic field $B_M$ of the magnetic graduation.

Preferably in accordance with a preferred embodiment of the present invention at least two Hall elements are employed within a magnetic position measuring device, which are operated in accordance with the so-called "spinning current principle." At least one switching unit 26 is provided for this purpose, which interchanges or connects the supply voltage connectors 1, 3 and the measuring voltage connectors 2, 4 of the Hall elements 13 with each other in a chronological periodic sequence. This preferably takes place at a relatively high frequency, preferably between about 10 kHz to about 200 kHz. Such an interchange of the supply voltage connectors 1, 3 and measuring voltage connectors 2, 4 inside the switching unit 26 is represented in schematic form in two switching phases for a single Hall element 13.

FIGS. 3A to 3D show the four possible switching phases for the Hall element 13 shown in FIG. 2. While in FIG. 3A the supply voltage $V_S$ provided by the supply voltage source 17 is present at the two connectors 1 and 3, which is intended to be made clear by means of the supply current i, the measuring voltage $U_H$ is picked up at the two connectors 2 and 4. In the subsequent measuring or switching phase shown in FIG. 3B the connectors 1, 3 and 2, 4 are interchanged with each other, i.e. the supply voltage $V_S$ is now applied to the two connectors 2 and 4 in the indicated direction, while the measuring voltage $U_H$ is picked up at the connectors 1 and 3. Analogously to this, in the switching phase represented in FIG. 3C the supply voltage $V_S$ is applied to the two connectors 3 and 1, but now in the opposite direction from that in the switching phase in accordance with FIG. 3A. The measuring voltage $U_H$ is again picked up at the two connectors 4 and 2, but also in the opposite direction from FIG. 3A. Finally, in the fourth switching phase represented in FIG. 3D, the supply voltage $V_S$ is applied to the two connectors 4 and 2, the measuring voltage $U_H$ is detected at the connectors 1 and 3; in this case the supply and measuring voltages are oriented opposite to the switching phase in accordance with FIG. 3B. Thus, in this arrangement the supply and measuring voltage connectors of the Hall element 13 employed are connected clockwise in the same direction by respectively 90° from one switching phase to the next.

On the output side, the resulting measurement signals reach the inputs of a differential amplifier 18, where further processing of the signals takes place. In the operational mode shown, an offset-free signal $V_H$, which is proportional to the magnetic field, is present at the output of the differential amplifier 18. An offset ac voltage portion is superimposed on this signal, which can be easily separated from the signal portion of interest by means of known filters. Thus, in the course of the relative movement between the magnetic graduation and the Hall element 13, a correspondingly amplitude-modulated measuring signal $V_H$ results at the differential amplifier output, which can be further processed in a known manner.

By means of the periodic through-connection of the supply and measuring voltage connectors over 360° and with suitable sum or difference formation it is therefore possible to eliminate the dc voltage portion of the magnetic field signal.

In accordance with the present invention, at least two such Hall elements operated in this way are required in a magnetic position measuring device in order to make the usually required direction discrimination possible. An appropriate schematic representation of a possible embodiment of the magnetic position measuring device in accordance with the present invention is found in FIG. 5.

Figure 4:
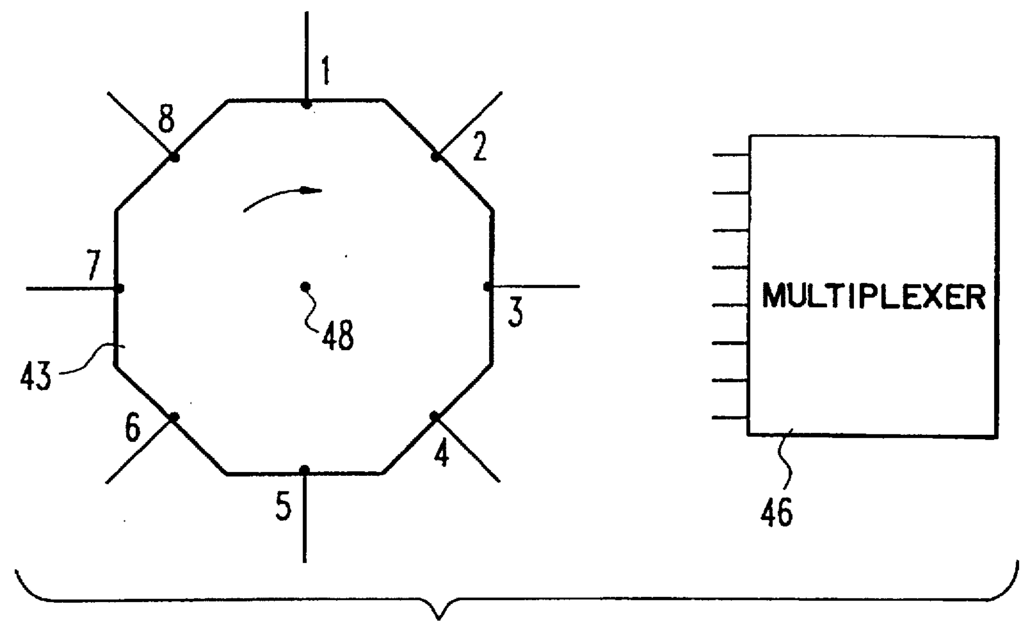
FIG. 4 illustrates another preferred embodiment of the Hall elements to be employed in the present invention.

However, at this point a suggestion for a further possible embodiment of the Hall elements operated in this manner in accordance with FIG. 4 should be mentioned. The Hall element 43 represented there has an octagonal shape, wherein four pairs of oppositely disposed supply voltage and measuring voltage connectors 1 to 8 are provided. The different connectors 1 to 8 are here cyclically distributed around the center 48 of the Hall element 43.

In such an embodiment of the Hall elements the supply and measuring voltages are cyclically connected through over only 45° in a chronologically periodic sequence of one switching phase after the other, by means of which it is possible to obtain an increase in accuracy of the determination of drift-free magnetic field signals. Generally speaking this means that in the case of n provided connectors, they are respectively arranged at angular distances of 360°/n with respect to each other and that correspondingly a periodic through-connection in steps of 360°/n steps takes place.

In addition to the Hall element 43, a multiplex unit 46 is shown in FIG. 4, also in schematic form, which assures the through-connection or interchange of the supply voltage and measuring voltage connectors 1 through 8 in a chronologically periodic sequence, i.e., it functions as a switching unit as described above.

Besides the rotation in the same direction of supply voltage and measuring voltage, it is furthermore possible by means of appropriate switching to realize an opposite through-connection of the different connectors. The result in this case is an ac voltage signal proportional to the magnetic field to be measured, as well as a zero dc voltage signal. Further processing of the ac voltage signal proportional to the magnetic field can take place, for example, by means of the known amplitude evaluation of carrier frequency signals, such as is common, for example, in connection with so-called synchro resolvers. In this connection reference is made to the chapter entitled "Abtastung mit Tr ägerfrequenz" [Scanning by Means of Carrier Frequency] in "Digitale Längen-und Winkelmeβtechnik" [Digital Longitudinal and Angular Position Measuring Technology] by A. Ernst, verlag moderne industrie AG, publishers, Landsberg, third edition, 1993, pp. 27–28.

It is furthermore possible to employ the most various combinations of Hall elements operated in this way in a magnetic position measuring device.

Figure 5:
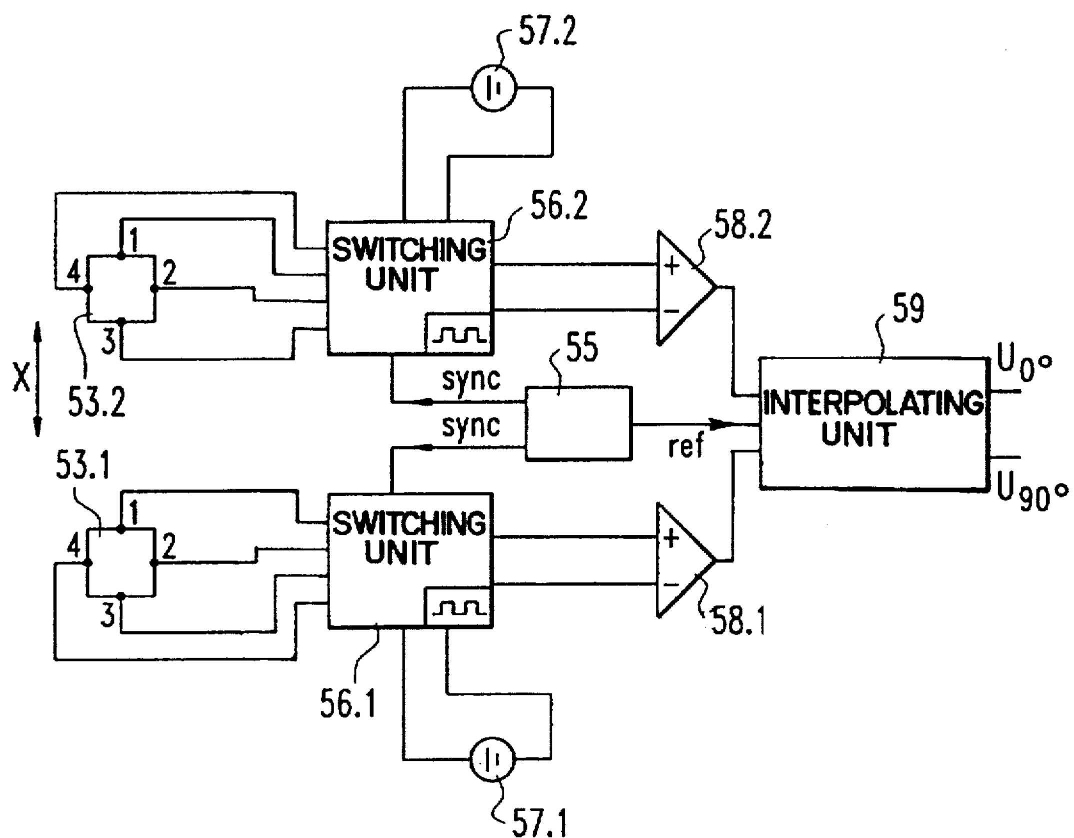
FIG. 5 is a block circuit diagram of a magnetic position measuring device with two Hall elements employed according to a preferred embodiment of the present invention.

As already previously mentioned, FIG. 5 shows a block diagram representation of a magnetic position measuring device with two Hall elements 53.1, 53.2 of square shape. Displacement of the two Hall elements 53.1, 53.2 with relation to the graduation, not shown, takes place in the drawing plane in the direction of the arrow. The two Hall elements 53.1, 53.2 are furthermore disposed inside the scanning unit, offset by a quarter of the graduation period of the magnetic graduation, so that a phase shift of 90° of the respective output signals results.

In the illustrated preferred embodiment, a switching unit 56.1, 56.2 is assigned to each one of the two Hall elements 53.1, 53.2, which periodically interchanges the supply voltage and measuring voltage connectors in a defined clock frequency or connects them through over 360° in 90° steps. The periodic interchange or through-connection is intended to be schematically indicated by the rectangular signal assigned to the respective switching units 56.1, 56.2, the same as in FIG. 3. The supply and the measuring voltages are again connected through in the same direction.

A supply voltage source 57.1, 57.2 is furthermore provided for each one of the two Hall elements 56.1, 56.2, which is also connected with the corresponding switching unit 56.1, 56.2.

Alternatively to this it is also possible to only provide a single switching unit or a single supply voltage source, which operate in a suitable multiplex mode.

The resulting signals are again supplied to suitable difference amplifiers 58.1, 58.2, the offset dc portion is separated and connected through to an interpolating unit 59, which again provides the two 0° and 90° counting signals $U_0$, $U_{90}$ required for further evaluation. The interpolating unit 59 provided again processes the amplitude-modulated signals occurring in the course of a relative movement of the scanning unit and the magnetic graduation in a known manner.

In addition, a synchronization unit 55 is provided in the magnetic position measuring device in accordance with the present invention, which sees to it that the cyclic through-connection of the supply and measuring voltages in the two Hall elements 53.1, 53.2 is performed synchronously with respect to each other. For this purpose, suitable synchronization signals sync are passed on to the switching units 56.1, 56.2. In addition, the synchronization unit 55 also clocks the interpolating unit 59 by means of a further reference signal (ref) For this purpose the synchronization unit 55 includes a suitable oscillator unit which generates the appropriate periodic clock signals.

Figure 6A:
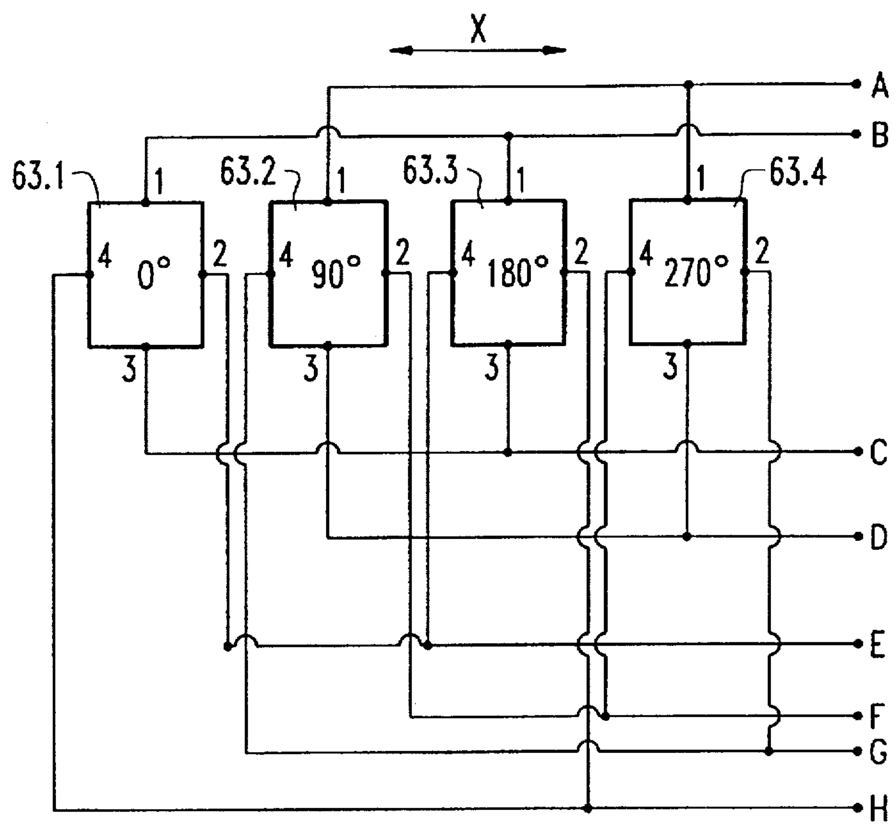
FIGS. 6A and 6B respectively show a portion of a block circuit diagram of another preferred embodiment of the position measuring device in accordance with the present invention with four Hall elements.
Figure 6B:
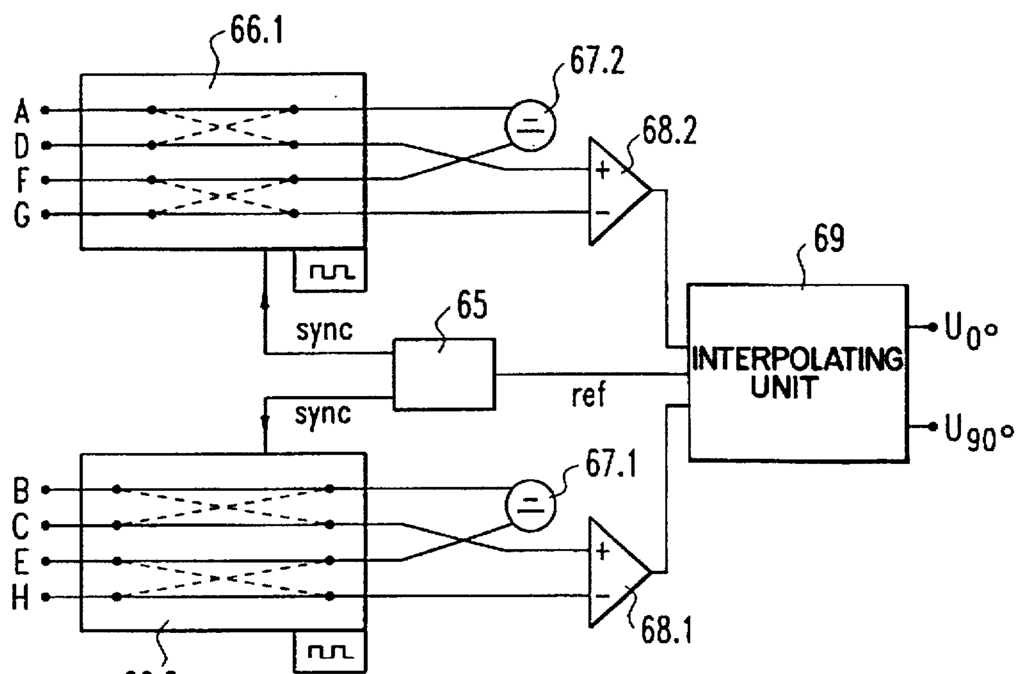

A further embodiment of the magnetic position measuring device in accordance with the present invention is schematically represented in the two FIGS. 6A and 6B. In this preferred embodiment four Hall elements 63.1, 63.2, 63.3, 63.4 are provided in the scanning unit, which are operated synchronized with each other as described above. The four Hall elements 63.1, 63.2, 63.3, 63.4 are respectively arranged at a distance of a quarter graduation period with respect to each other and provide four output signals during the relative movement between the graduation and the scanning unit in the measuring direction X, which are respectively phase-shifted by 90° with respect to each other. In this way a further, more extensive improvement of the resolution or an optimized signal gain are assured.

The represented preferred embodiment includes two switching units 66.1, 66.2, two supply voltage sources 67.1, 67.2, two differential amplifiers 68.1, 68.2 and an interpolating unit 69 and a synchronization unit 65, which are basically operated as described above. The Hall element outputs 1, 2, 3, 4 are wired together in the represented manner and have a total of eight outputs A to H which, in the form represented, are connected to the inputs of the switching units 66.1, 66.2 and are periodically connected through in a corresponding manner.

Thus, in the preferred embodiment shown in FIGS. 6A and 6B the same two outputs of respectively two Hall elements 63.1, 63.2, 63.3, 63.4 have been wired combined in groups, so that only one common switching unit 66.1, 66.2 is required for each one of the two groups. Accordingly, the first group includes the first and third Hall elements from the left 63.1, 63.3, while the second and fourth Hall elements 63.2, 63.4 are combined in the second group.

In a further preferred embodiment it is provided to arrange the Hall elements operated in accordance with the present invention and the subordinate processing units in an integrated form on a support substrate or chip and in this way to assure a compact design of the scanning unit. In this case the various components, such as sensors and the electronic control and evaluation units are produced in accordance with CMOS technology.

It is to be understood that the forms of the present invention described herewith are to be taken as preferred examples and that various changes in the shape, size and arrangement of parts may be resorted to, without departing from the spirit of the present invention or scope of the claims.

What is claimed is:

1. A magnetic position measuring device for determining the relative position of two objects which are movable with respect to each other, wherein a magnetic graduation is scanned by at least two Hall elements, each of the Hall elements generates, position-dependent, periodic output signal when the graduation is scanned by the two Hall elements, wherein the Hall elements each have at least one supply voltage and one measuring voltage connector, the device comprising:

at least one switching unit which periodically interchanges the supply voltage and measuring voltage connectors of each Hall element with each other; and at least one synchronization unit which passes synchronization signals to the switching unit so that the periodic interchange of the supply voltage and the measuring voltage of one of said Hall elements is performed synchronously with respect to the other of said Hall elements so that said position-dependent periodic output signals have a phase shift of 90° with respect to each other.

2. The magnetic position measuring device according to claim 1, wherein several Hall elements are provided, whose supply voltage and measuring voltage connectors are connected with each other in groups, and that a common switching unit is provided for each group.

3. The magnetic position measuring device according to claim 1, wherein the Hall elements used respectively have n supply voltage and measuring voltage connectors alternately disposed cyclically around the center of the Hall sensor, which are arranged at angular distances of 360°/n from each other.

4. The magnetic position measuring device according to claim 1, wherein a magnetic graduation with a fixed graduation period (T) is provided, and at least two Hall elements are disposed, offset from each other by the distance of a quarter graduation period of the magnetic graduation, so that the resulting electrical output signals of the at least two Hall elements have a phase shift of 90° from each other.

5. The magnetic position measuring device according to claim 1, wherein an interpolating unit for generating counting pulses is disposed downstream of the Hall elements.

6. The magnetic position measuring device according to claim 1, further comprising an oscillator unit assigned to the synchronization unit, which provides a periodic clock signal which determines the switching frequency.

7. The magnetic position measuring device according to claim 1, wherein the Hall elements employed, together with the switching and synchronization unit are arranged on a single chip in an integrated construction.

8. A method for operating a magnetic position measuring device for determining the relative position of two objects which are movable with respect to each other, the method comprising the steps of:

providing a magnetic graduation;

providing at least two Hall elements, each Hall element having a supply and measuring voltage;

scanning the magnetic graduation with the at least two Hall elements and generating a periodic position-dependent output signal with each of the two Hall elements;

providing a switching unit for periodically interchanging the supply and measuring voltages of each Hall sensor; and providing a synchronization unit that passes synchronization signals to the switching unit so that the periodic interchange of the supply voltage and the measuring voltage of one of said Hall elements is performed synchronously with respect to the other of said Hall elements so that said position-dependent periodic output signals have a phase shift of 90° with respect to each other.

9. The method according to claim 8, further comprising the step of supplying output signals of the Hall elements to an interpolating unit for generating counting pulses.

10. The method according to claim 8, wherein the supply and measuring voltages of the Hall elements are connected through in the same direction.

11. The method according to claim 8, wherein the supply and measuring voltages of the Hall elements are connected through in opposite directions.

12. A magnetic position measuring device for determining the relative position of two objects which are movable with respect to each other, wherein a magnetic graduation is scanned by at least two Hall elements for generating position-dependent output signals, wherein the Hall elements each have at least one supply voltage and one measuring voltage connector, the device comprising:

at least one switching unit which periodically interchanges the supply voltage and measuring voltage connectors of each Hall element with each other;

at least one synchronization unit which synchronizes the periodic interchange of the supply voltage and measuring voltage connectors of the different Hall elements with each other; and an oscillator unit assigned to the synchronization unit which provides a periodic clock signal which determines the switching frequency.

* * * * *